(12) United States Patent
Miyata et al.

(10) Patent No.: US 9,530,246 B2
(45) Date of Patent: Dec. 27, 2016

(54) COLLISION DETERMINATION DEVICE AND COLLISION DETERMINATION PROGRAM

(75) Inventors: Akira Miyata, Tokyo (JP); Nobuyuki Takahashi, Tokyo (JP); Toshihiro Azuma, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 428 days.

(21) Appl. No.: 13/144,702

(22) PCT Filed: Sep. 10, 2009

(86) PCT No.: PCT/JP2009/065860
§ 371 (c)(1),
(2), (4) Date: Jul. 15, 2011

(87) PCT Pub. No.: WO2010/082378
PCT Pub. Date: Jul. 22, 2010

(65) Prior Publication Data
US 2011/0295576 A1     Dec. 1, 2011

(30) Foreign Application Priority Data

Jan. 15, 2009   (JP) .................................. 2009-006840

(51) Int. Cl.
*G06F 7/60*     (2006.01)
*G06F 17/10*    (2006.01)
(Continued)

(52) U.S. Cl.
CPC .............. *G06T 17/00* (2013.01); *B25J 9/1676* (2013.01); *G05B 19/4061* (2013.01);
(Continued)

(58) Field of Classification Search
CPC ...... G06T 17/00; G06T 17/10; G06T 2210/21;
G05B 19/4061; G05B 2219/49157; G05B 2219/40442; G05B 2219/49143; B25J 9/1676; G06F 17/50; Y02P 90/265
(Continued)

(56) References Cited

U.S. PATENT DOCUMENTS 5,548,694 A    8/1996   Gibson
5,761,391 A    6/1998   Sato et al.
(Continued)

FOREIGN PATENT DOCUMENTS

DE   10 2006 059 829 A1   6/2008
JP         8 285469        11/1996
(Continued)

OTHER PUBLICATIONS

He, Taosong et al. "Collision Detection for Volumetric Objects", 1997, Visualization '97, Proceedings, IEEE.*
(Continued)

*Primary Examiner* — Cedric D Johnson
(74) *Attorney, Agent, or Firm* — Oblon, McClelland, Maier & Neustadt, L.L.P.

(57) ABSTRACT

A collision determination device includes a target cell designation unit that designates a target cell for a voxel model which represents the shape of a first object. A determination test point generation unit generates determination test points for the target cell. A spatial curve creation unit creates a spatial curve as the trajectory curve of a determination test point. A curve intersecting determination unit determines whether or not each boundary element of a boundary representation model representing the shape of a second object is intersecting the spatial curve. A distance computation unit computes the closest distance from the spatial curve to the boundary surface of the boundary representation model. A collision determination unit determines, based on the deter-
(Continued)

mination result and the computation result, whether there is a possibility of collision between both objects.

8 Claims, 4 Drawing Sheets

(51) Int. Cl.
  *G06T 17/00* (2006.01)
  *B25J 9/16* (2006.01)
  *G05B 19/4061* (2006.01)
  *G06F 17/50* (2006.01)

(52) U.S. Cl.
  CPC .............. *G05B 2219/40442* (2013.01); *G05B 2219/49143* (2013.01); *G05B 2219/49157* (2013.01); *G06F 17/50* (2013.01); *G06T 2210/21* (2013.01); *Y02P 90/265* (2015.11)

(58) Field of Classification Search
  USPC ...................................... 703/2; 345/473, 424
  See application file for complete search history.

(56) References Cited

U.S. PATENT DOCUMENTS

| | | | |
|---|---|---|---|
| 6,396,492 | B1 | 5/2002 | Frisken et al. |
| 6,714,213 | B1 | 3/2004 | Lithicum et al. |
| 7,136,786 | B2* | 11/2006 | Frisken et al. .................... 703/2 |
| 2002/0130858 | A1 | 9/2002 | Perry et al. |
| 2004/0010346 | A1* | 1/2004 | Stewart .................. G06F 3/011 700/255 |

FOREIGN PATENT DOCUMENTS

| | | |
|---|---|---|
| JP | 10 74215 | 3/1998 |
| JP | 2726811 | 3/1998 |
| JP | 2002 329215 | 11/2002 |
| JP | 2003-346186 A | 12/2003 |
| JP | 2007 114866 | 5/2007 |

OTHER PUBLICATIONS

Huang, Yunching et al. "Integrated Simulation, Error Assessment, and Tool Path Correction for Five-Axis NC Milling", 1995, Journal of Manufacturing Systems, vol. 14, No. 5.*
Kitamura, Yoshifumi et al., "Parallel Algorithms for Real-Time Colliding Face Detection", 1995, IEEE International Workshop on Robot and Human Communication, IEEE.*
Adzhiev, Valery et al. "Hybrid System Architecture for Volume Modeling", 2000, Computers & Graphics 24, Elsevier Science Ltd.*
Figueiredo, Mauro et al. "A Survey on Collision Detection Techniques for Virtual Environments", 2002, Proc. of V. Symposium in Virtual Reality, vol. 307.*
Poutrain, Kai et al., "Dual Brep-CSG Collision Detection for General Polyhedra", 2001, IEEE.*
Moore, Matthew et al., "Collision Detection and Response for Computer Animation", Aug. 1988, Computer Graphics, vol. 22, No. 4, ACM.*
Jimenez, P. et al., "Collision Detection Algorithms for Motion Planning", 1998, Robot Motion Planning and Control, Springer Berling Heidelberg.*
Decision of a Patent Grant issued Jul. 24, 2012 in Japanese Patent Application No. 2010-546541 with English Translation.
Kubota, J. et al., "Voxel Based Rigid Body Dynamics", The Computational Mechanics Conference, pp. 13-14, (Nov. 22, 2003).
Frisken, S. F. et al., "Adaptively Sampled Distance Fields: A General Representation of Shape for Computer Graphics", Mitsubishi Electric Research Laboratories, Total 7 Pages, (Dec. 2000).
International Search Report Issued Oct. 20, 2009 in PCT/JP09/065860 filed Sep. 10, 2009.
Office Action issued Dec. 19, 2013 in German Patent Application No. 11 2009 004 371.2 (with English language translation).
German Office Action mailed Feb. 26, 2014 for German patent application 11 2009 004 371.2-53, including Protocol of Hearing and Reasons of the Decision, with English translation.
Chinese Office action mailed Feb. 21, 2014 for Chinese patent application 200980154608.7, with partial English translation.
Office Action issued Jun. 13, 2016 in German Application No. 11 2009 004 371.2 (with English-language Translation).

* cited by examiner

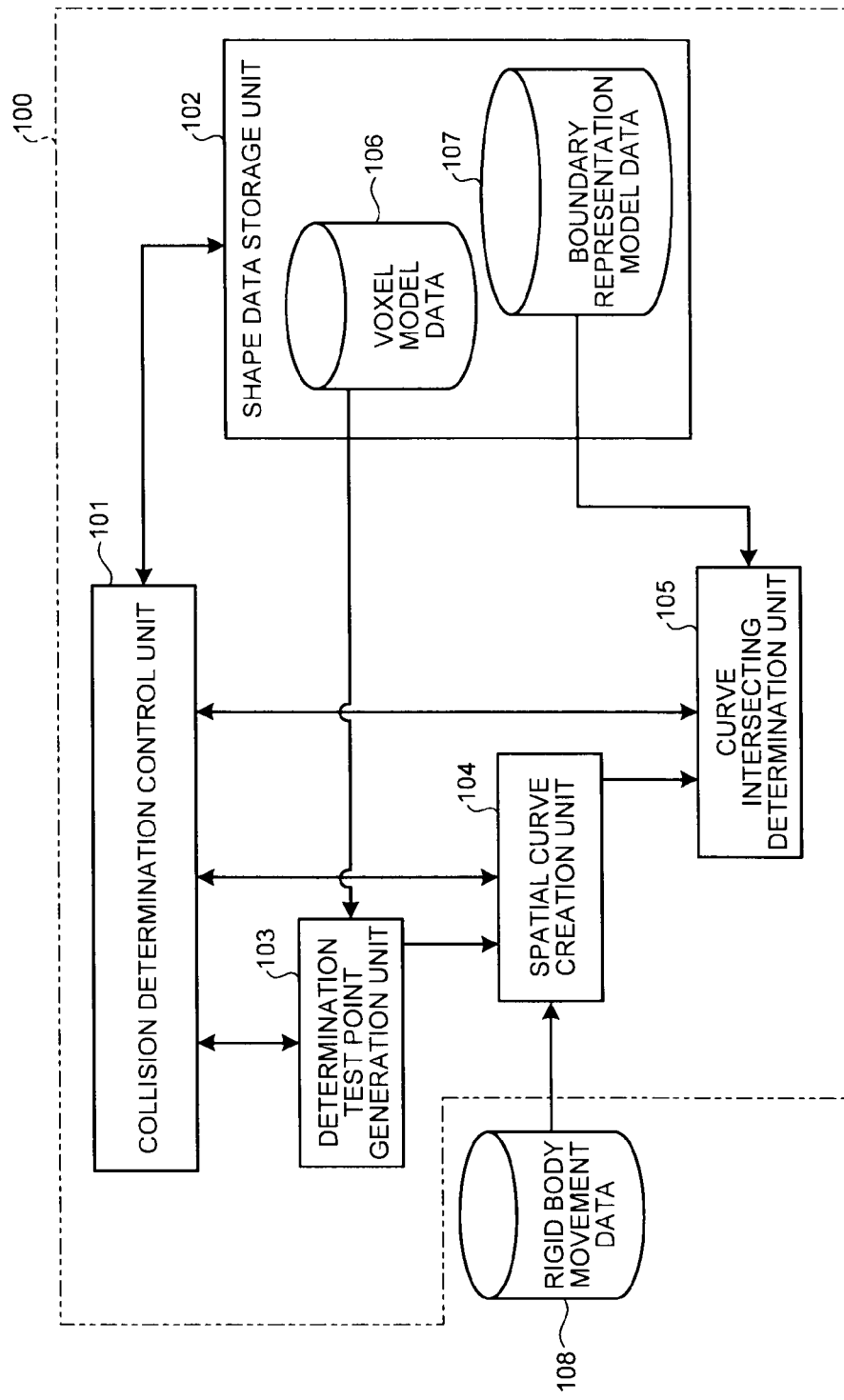

US 9,530,246 B2

COLLISION DETERMINATION DEVICE AND COLLISION DETERMINATION PROGRAM

FIELD

The present invention relates to a collision determination device and a collision determination program for determining the presence or absence of a collision between objects moving in a two-dimensional or three-dimensional space. More particularly, the invention relates to a collision determination device and a collision determination program for detecting a collision between a mechanical component of a machine tool and a work in a simulation device for simulating the cutting process in the machine tool.

BACKGROUND

To handle collision events between moving objects with each object moving relative to another, the relative movement of one object viewed from another object can be taken into account, reduced to a collision event between a stationary object and a moving object. Hereinafter, the discussions below will be focused on a collision event between a stationary object and a moving object.

As one technique for detecting a collision between such objects; there is a method for creating a sweep shape by sweeping the shape of a moving object along its trajectory and then determining whether or not the sweep shape and the shape of a stationary object are intersecting (hereinafter referred to as the sweep method). Also there is another method for determining whether or not the shapes of a moving object and a stationary object are intersecting, at every instant as defined by dividing the duration of movement from start to end by an appropriate interval (hereinafter referred to as the time division method). The fundamental difference between both methods lies in that a temporally continuous event of object movement is treated as it is or as a discrete one.

However, the sweep method has no efficient general-purpose technique of creating a sweep shape by an arbitrary movement of an arbitrary shape and, particularly, creating a sweep shape for a typical rigid body movement that accompanies not only a change in position but also a change in attitude. That is, the sweep method is not readily applicable but only to a specific case in which the moving object has a limited type of shape or movement. Furthermore, the sweep method has not been in practical use because it requires higher computational costs for determining whether a complicated sweep shape and a stationary object shape are intersecting.

The time division method is generally said to require lower computational costs as compared to the sweep method. However, finer division intervals increase the number of times of determining intersections, causing the overall computational costs not to be negligible. On the other hand, coarser division intervals cause a malfunction of the method, leading to a higher possibility of a collision being accidentally not detected.

In this context, based on the time division method, efforts have been made to cut computational costs per one determination of intersection. Such methods includes, for example, one disclosed in Patent Literature 1.

CITATION LIST

Patent Literature

Patent Literature 1: Japanese Patent Application Laid-open No. 2007-114866

SUMMARY

Technical Problem

Since the method disclosed in Patent Literature 1 is based on the time division method, the unsuccessful detection of collisions due to the malfunction caused by the aforementioned coarser division and the increase in overall computational costs caused by the finer division have not yet been addressed. Furthermore, the shapes of both objects to be determined are defined in the form of a space grid model, thus requiring a large quantity of memory for processing by a computer. These problems will become more distinct or serious particularly when handling three-dimensional shapes.

In the field of cutting process simulation for machine tools, a work or one of the objects of which collisions are to be determined will be changed in shape as the work is processed, exhibiting more complicated shapes during the process. Thus, the shape of the work is often represented by a space grid model such as a voxel model that has no restrictions on the phase structure. However, using the space grid model to represent a mechanical component of a machine tool or another one of the objects of which collisions are to be determined, only in order to determine a collision requires considerable penalties in the amount of the aforementioned memory and is not practical.

The present invention was achieved in view of the aforementioned problems. It is an object of the invention to provide a collision determination device and a collision determination program which eliminates the need of processing at high computational costs and can determine collisions at high speeds with high reliability using a reduced amount of data memory while reducing the possibility of collisions being accidentally not detected.

Solution to Problem

In order to solve the aforementioned problems and attain the aforementioned object, the collision determination device is provided with: a shape data storage unit for storing both voxel model data indicative of a shape of a first object for a voxel model and boundary representation model data indicative of a shape of a second object for a boundary representation model, the voxel model being defined by a coordinate system fixed to the first object, the boundary representation model being defined by a coordinate system fixed to the second object; a target cell designation unit for designating a target cell to determine a collision among cells constituting the voxel model; a determination test point generation unit for generating determination test points to determine a collision for the target cell; a spatial curve creation unit for creating a spatial curve or a trajectory curve of the determination test point by applying a relative rigid body movement of the first object with respect to the second object to each of determination test points; a curve intersecting determination unit for determining whether or not each boundary element of the boundary representation model is intersecting the spatial curve; a distance computation unit for computing a closest distance from the spatial curve to a boundary surface of the boundary representation model, when a determination result provided by the curve intersecting determination unit shows that the spatial curve intersects no boundary element; and a collision determination unit for determining whether there is a possibility of both objects colliding with each other, based on both the determination result provided by the curve intersecting determination unit and a computation result provided by the distance computation unit.

Advantageous Effects of Invention

The collision determination device of the present invention determines the possibility of a collision between objects based on the determination of an intersection of a boundary element of a boundary representation model and the trajectory curve of a determination test point. This allows for handling a temporally continuous event of object movement as it is, thus eliminating the problem with the time division method or the possibility of a collision being accidentally not detected due to a malfunction of the method. Furthermore, the sweep shape of a moving object needs not to be created and the determination of an intersection of the aforementioned trajectory curve can be reduced to an equation with one curve parameter unknown. This makes it possible to reduce the amount of computation and determine collisions at high speeds. Furthermore, the shape of one object of which collision is to be determined is represented by the boundary representation model. This allows for determining a collision with a reduced amount of data in the case of a shape, such as that of mechanical parts, with a small number of constituent surfaces.

BRIEF DESCRIPTION OF DRAWINGS

FIG. 1 is a block diagram illustrating an embodiment of a collision determination device of the present invention.

DESCRIPTION OF EMBODIMENTS

First Embodiment

Figure 2A:
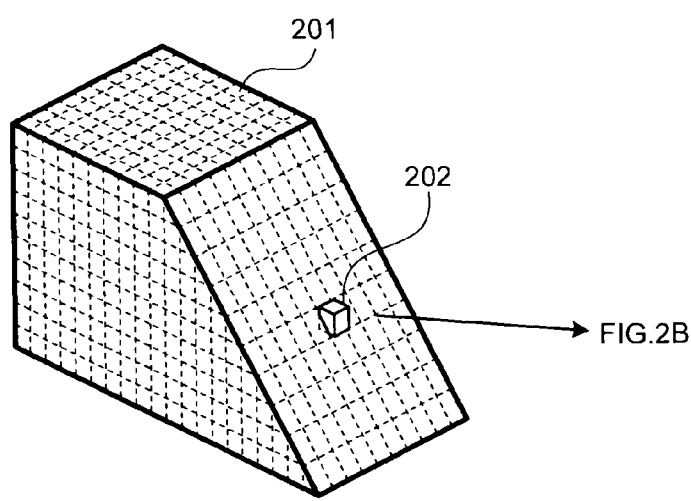
FIG. 2 is an explanatory view illustrating the fundamental principle of a collision determination method of the present invention.

Now, a collision determination device and a collision determination program according to the embodiments of the present invention will be described in more detail with reference to the accompanying drawings. Note that these embodiments will not limit the invention in any way.

FIG. 1 is a block diagram illustrating a general configuration of such a collision determination device according to the present invention. In FIG. 1, a collision determination device 100 is configured to have a collision determination control unit 101, a shape data storage unit 102, a determination test point generation unit 103, a spatial curve creation unit 104, and a curve intersecting determination unit 105. The shape data storage unit 102 stores a voxel model data 106 that represents the shape of a first object, of which collision is to be determined, using a voxel model defined in a coordinate system fixed to the first object. The shape data storage unit 102 also stores and retains a boundary representation model data 107 that represents the shape of a second object, of which collision is to be determined, using a boundary representation model defined in a coordinate system fixed to the second object. Furthermore, a rigid body movement data 108 indicative of a relative rigid body movement of the first object with respect to the second object is prepared outside the collision determination device 100 and then supplied to the spatial curve creation unit 104.

Here, as used herein, the term "voxel model" refers to a model that represents a physical quantity at each grid point of a grid organized in a hierarchical tree, for example, an equally spaced grid or a quad-divided or octo-divided grid in a two-dimensional or three-dimensional spatial region. For representation of shapes, the voxel model refers to a model which contains, as a physical quantity, the inner and outer identification information at a grid point for a represented shape or information such as a signed distance to the boundary of the represented shape. Furthermore, in the voxel model, a square or cubic region with adjacent grid points at a predetermined interval being corner points is referred to as the "cell." In a voxel model organized in a hierarchical tree, the smallest cell at the lowest level is to be called the "distal end cell" and a cell at an intermediate level to be called the "intermediate node cell."

Furthermore, as used herein, the term "boundary representation model," which is typically referred to as the Boundary-Representation model or B-Reps model, is a shape representation model which provides representations with a collection of shaped and oriented boundary elements and an adjacent phase structure between those elements. The boundary element refers to the side that constitutes the boundary line in the two-dimensional shape, while referring to the plane that constitutes the boundary surface in the three-dimensional shape.

Note that as the voxel model data 106 stored and retained in the shape data storage unit 102, the present first embodiment employs an adaptively-sampled distance field described in Frisken et al. "Adaptively Sampled Distance Fields: A General Representation of Shape for Computer Graphics," Proc. SIGGRAPH 2000, pp. 249 to 254, 2000. The adaptively-sampled distance field is a type of method or representation model which represents the space, in which the shape represented object is placed, as a distance field (also referred to as the "Kyoriba" in Japanese) or a type of a scalar field. The model allows for sampling signed distances to the boundary of the represented shape at a grid point organized in a hierarchical tree by quad division or octo division according to the dimension of the space. The model is also allowed to restore the value of the distance field at a given spatial coordinate point other than the sampled points by interpolation or the like.

Now, a description will be made to the operation of each unit. Note that although the present invention does not depend on whether the object of which collision is to be determined has a two-dimensional or three-dimensional shape, for the sake of clarity of description, the first embodiment will be described bearing a three-dimensional shape in mind.

The collision determination control unit 101 receives a collision determination request from outside the collision determination device 100 and identifies in the voxel model data 106 a group of candidate cells as a candidate of which collision with the second object is to be determined. The collision determination control unit 101 commands in sequence each of the determination test point generation unit 103, the spatial curve creation unit 104, and the curve intersecting determination unit 105, to determine the intersection of the individual cells in the group of candidate cells. The collision determination control unit 101 determines whether there is a possibility of a collision between the first object and the second object, based on the intersection determination result provided by the curve intersecting determination unit 105. The collision determination control unit 101 repeatedly provides the commands to each of the units until it is finally determined under a given acceptable margin whether or not there is a collision. That is, the collision determination control unit 101 serves also as a collision determination unit for determining whether there is a possibility of a collision between both objects. Note that the contents of the operation will be described in more detail below.

The determination test point generation unit 103 receives a command from the collision determination control unit 101 to operate. In this first embodiment, the determination test point generation unit 103 generates, as a determination test point (or a determined objective point), a point located at a corner of an individual cell designated by the collision determination control unit 101. Furthermore, in this first embodiment, the determination test point generation unit 103 is configured to generate, as a determination test point, a point located at a corner and the center of a sub-cubic region obtained by recursively octo-dividing the occupied cubic region of a distal end cell. Note that a determination test point can also be generated at the center of the cell.

From the determination test point generated by the determination test point generation unit 103 and the rigid body movement data 108, the spatial curve creation unit 104 creates a spatial curve indicative of a trajectory curve, which is formed by moving the determination test point based on the rigid body movement data 108. The rigid body movement data 108 represents a typical rigid body movement in a combination of a rotational movement and a translational movement with time or a parameter (denoted by "s") equivalent to time as a variable. More specifically, the data is described in a pair of a 3×3 rotation matrix $R(s)$ and a translational vector $T(s)$ with each component being a function of the parameter s. The created spatial curve data is described as $C(s)=[Cx(s), Cy(s), Cz(s)]^T=R(s) \cdot P+T(s)$ with the determination test point denoted by P. Note that the rigid body movement data 108 may be expressed in a 4×4 homogeneous coordinate transformation matrix $M(s)$ or in a given form that allows for deriving these parametric representations.

From the spatial curve created by the spatial curve creation unit 104 and the curved surface data of each constituent surface of the boundary representation model data 107, the curve intersecting determination unit 105 determines whether the spatial curve is intersecting the constituent surface in a region surrounded by ridges. More specifically, suppose that the curved surface data of a constituent surface is given in a parametric representation with two variables u and v, i.e., $S(u, v)=[Sx(u, v), Sy(u, v), Sz(u, v)]^T$. In this case, what can be done is to check whether the simultaneous equations with three unknowns, $S(u, v)=C(s)$, can have a solution within the defined region of the curve parameter s and the region of a constituent surface. On the other hand, suppose that the curved surface data is given by an implicit function, $F(X, Y, Z)=0$. In this case, what is required is to check whether an equation with one unknown, $F(Cx(s), Cy(s), Cz(s))=0$, can have a solution within the defined region of the curve parameter s and the region of a constituent surface.

Furthermore, when the aforementioned intersection determination shows that the spatial curve is intersecting no constituent surfaces of the boundary representation model data 107, the curve intersecting determination unit 105 computes the closest distance from the spatial curve to the boundary surface of the boundary representation model data 107. Still furthermore, in the present first embodiment, the aforementioned intersection determination may also show that the spatial curve intersects any one constituent surface of the boundary representation model data 107. In this case, in response to a request from the collision determination control unit 101, the curve intersecting determination unit 105 is configured to compute the innermost distance to the boundary surface of the boundary representation model data 107 from the spatial curve located at a position deeper than the boundary surface. That is, the curve intersecting determination unit 105 also serves as a distance computation unit for computing the closest distance and the innermost distance.

Here, when the shortest distance between a point and a boundary surface is considered in terms of a signed distance with the sign being positive outside the shape and negative inside it, the closest distance and the innermost distance can be determined as a distance at a location where the signed distance is minimized on the spatial curve.

Figure 2B:
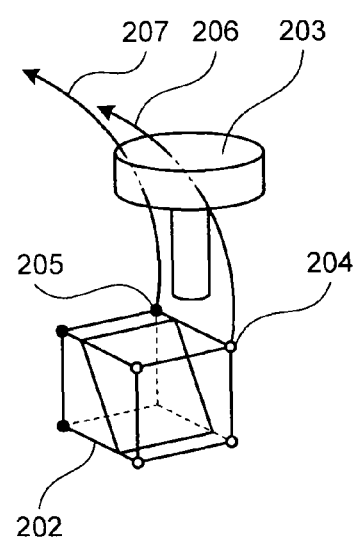

Now, the operation of the collision determination control unit 101 will be described in more detail. First, a description will be made to the fundamental principle of the collision determination method according to the present invention. FIG. 2A and FIG. 2B are an explanatory view illustrating the fundamental principle of the collision determination method. In FIG. 2A, of a group of cells that constitute a voxel model 201, a cell like a cell 202, which a boundary surface of the voxel model 201 traverses, is referred to as a boundary cell. The cell of which collision is determined is referred to as a target cell. The target cell is designated by the collision determination control unit 101. That is, the collision determination control unit 101 also serves as a target cell designation unit.

Now, with the cell 202 being a target cell, a description will be made as to how to determine whether or not there is a collision. In the enlarged view of the cell 202 shown in FIG. 2B, an outer corner point 204 denoted by a hollow circle is located outside the voxel model 201, whereas an inner corner point 205 denoted by a black circle is located inside the voxel model 201. Note that a boundary representation model 203 shows the shape of the second object of which collision is to be determined.

When the voxel model 201 moves relative to the boundary representation model 203, these corner points draw trajectories as denoted with an arrow 206 and an arrow 207 of FIG. 2B. These trajectory curves are expressed as spatial curves. It is then checked whether or not the trajectory curve and the constituent surface of the boundary representation model are intersecting. This allows for determining based on the following conditions whether there is a possibility of a collision between the voxel model 201 and the boundary representation model 203 in the region of the cell 202.

Condition 1: the trajectory curve of any one of the inner corner points of the cell 202 (for example, the trajectory curve or arrow 207 of the inner corner point 205) may intersect any one of the constituent surfaces of the boundary representation model 203. In this case, it can be seen that the voxel model 201 obviously collides with the boundary representation model 203 in the region of the cell 202, without determining an intersection between all the corner points of the cell 202 and the constituent surface.

Condition 2: irrespective of the inner corner point and the outer corner point, the trajectory curve of any one of the corner points of the cell 202 may intersect no constituent surface of the boundary representation model 203, and the closest distance from the trajectory curve to the boundary surface of the boundary representation model 203 may be greater than a reference value to be described later. In this case, it can be seen that the voxel model 201 obviously does not collide with the boundary representation model 203 in the region of the cell 202, without determining an intersection between all the corner points of the cell 202 and the constituent surface.

Condition 3: the trajectory curve of any one of the outer corner points of the cell 202 (e.g., the trajectory curve 206 of the outer corner point 204) may intersect any one of the constituent surfaces of the boundary representation model 203, and the innermost distance from the trajectory curve to the boundary surface of the boundary representation model 203 may be greater than a reference value to be described later. In this case, it can be seen that the voxel model shape obviously collides with the boundary representation model 203 in the region of the cell 202, without determining an intersection between all the corner points of the cell 202 and the constituent surface.

When the aforementioned conditions 1 to 3 are not satisfied, it could not be determined whether there has occurred a collision. In this case, if the cell 202 is an intermediate node cell, then with a child cell in the immediately lower level employed as a target cell, the determination can be recursively repeated based on the aforementioned conditions. If the cell 202 is a distal end cell, then for a voxel model which employs the adaptively-sampled distance field as with the first embodiment, it can be identified whether a given point within the cell is an inner or outer one based on the sign of the distance field value at the point. Accordingly, the occupied cubic region of the distal end cell can be recursively octo-divided into sub-cubic regions to generate the corner points thereof, based on which the determination can be repeated under the aforementioned conditions.

The reference value of the distances to be used in the aforementioned conditions 2 and 3 can be the diagonal length of the target cell. More strictly, the reference value of the distance for Condition 2 is an arbitrary value which has, as the lower bound, the distance from a target corner point of the target cell to the farthest point inside the voxel model shape or on the boundary surface within the target cell. Considering a sphere having the aforementioned distance as its radius with the corner point at its center, the sphere inevitably contains part of the shape of the voxel model. According to Condition 2, the sphere can be said not to intersect the shape of the boundary representation model even at any point in time during the rigid body movement of the sphere. Furthermore, the reference value of the distance for Condition 3 is an arbitrary value; which has, as the lower bound, the distance from an outer target corner point to the boundary surface of the voxel shape located closest to the corner point within the target cell. The outer target corner point is located outside the shape of the voxel model. However, considering a sphere having the aforementioned distance as its radius with the corner point at its center, the sphere inevitably contains part of the shape of the voxel model. According to Condition 3, a partial shape of the voxel model contained in the sphere during rigid body movement can be said to intersect the shape of the boundary representation model at a given point in time. Note that the determination based on the aforementioned Condition 2 may be made for any point within the target cell. For example, for the center point of the cell, the reference distance value can be half the diagonal length of the target cell. Here, as compared with the case where the diagonal length of the target cell is employed as the reference value, the distance between the corner point and a point on the boundary surface makes it possible to facilitate earlier determination of the presence or absence of a collision and to perform processing at higher speeds.

Furthermore, for a voxel model that employs the adaptively-sampled distance field as in this first embodiment, the distance field value at a corner point can be taken as a reference value for a determination based on Condition 3 above. Furthermore, the sign of the distance field value can be examined to know whether a given point is inside or outside the target cell, so that a determination is made based on Conditions 1 and 3 described above.

Note that the determination under Conditions 1 and 3 described above may be made only for the boundary cell of the voxel model 201. This is because of the following reasons. For an outer cell located outside the represented shape, obviously, there is no collision between the objects. Furthermore, since there will be inevitably a collision in a region of the boundary cell in the course from the absence of collisions to the occurrence of a collision, no determination is required for inner cells that are located inside the represented shape.

Figure 3:
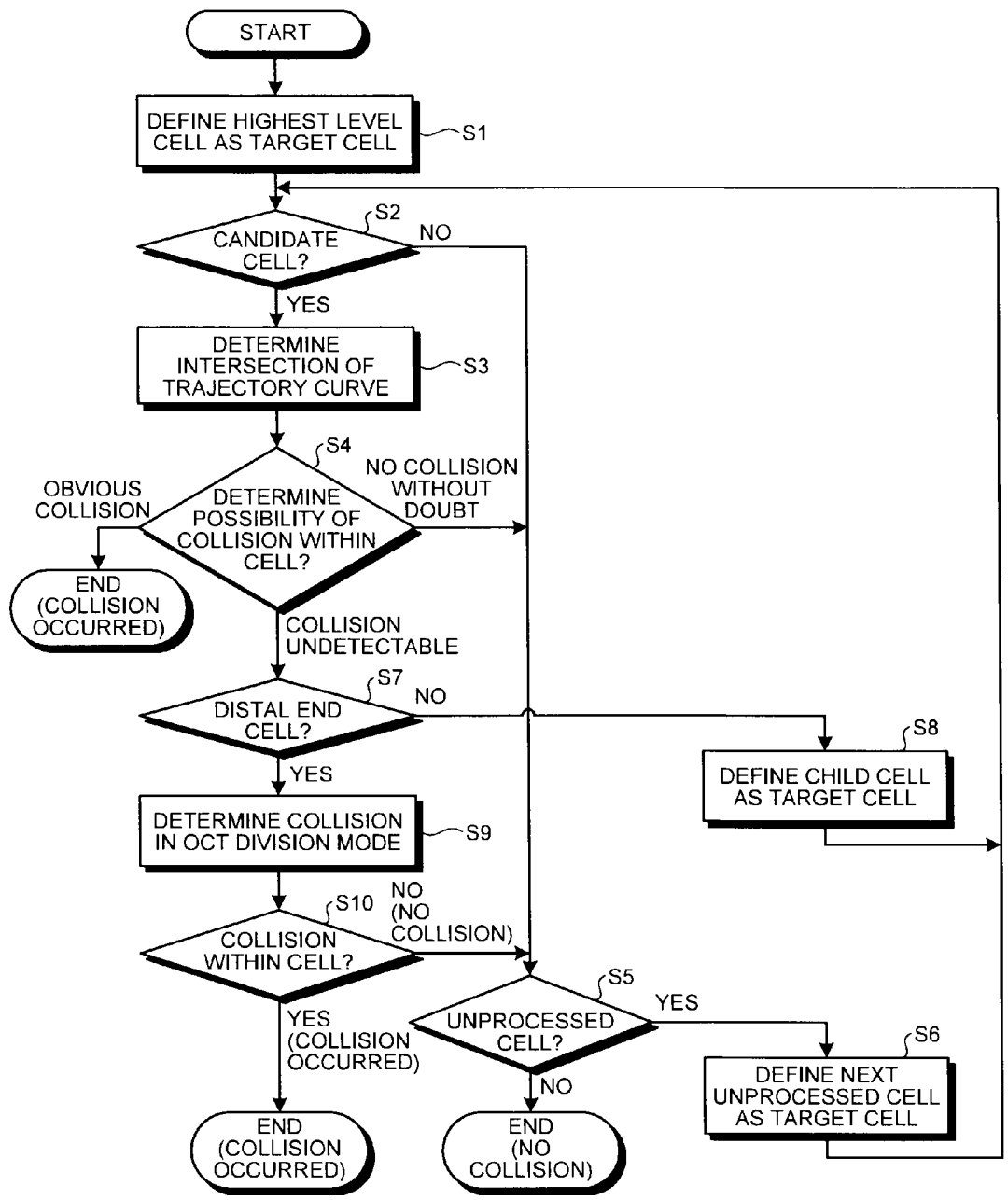
FIG. 3 is an explanatory flowchart for a collision determination sequence of the present invention.

The collision determination control unit 101 determines whether there is a collision between objects based on the aforementioned fundamental principle of collision determination. FIG. 3 is a view showing a process flow of the collision determination. This process cycles the tree hierarchy of the voxel model shape, starting from the highest level cell with priority assigned to depth.

First, the highest level cell of the voxel model data 106 is defined as a target cell (Step S1). Then, it is determined whether the target cell can be a candidate cell of which collision with a second object is to be determined (Step S2). This is determined, for example, based on the relative rigid body movement of the second object with respect to the first object, the relation of which is opposite to that of the rigid body movement data 108. More specifically, the bounding box in the coordinate system for the first object is predetermined, including an approximate movable range of the second object, so that it is determined whether the target cell is within the bounding box.

If the target cell is a candidate cell, the process commands the determination test point generation unit 103 to generate determination test points for the target cell. The process also commands the spatial curve creation unit 104 to create a group of trajectory curves for each of the determination test points and the curve intersecting determination unit 105 to determine whether the trajectory curve and each boundary element of the boundary representation model data 107 are intersecting with each other (Step S3). In Step S4, the process makes a determination based on Conditions 1 to 3 described above (Step S4).

When the determination result indicates an obvious collision, then the process confirms the "presence of a collision" and exits the flow. If no collision will occur without any doubt, then the process defines, as the next target cell, an unprocessed brother cell of the target cell or otherwise an unprocessed brother cell of the immediately upper level cell (Steps S5 to S6). If the next target cell is not available, then the process confirms the "absence of a collision" and exits the flow.

If it cannot be determined whether there is a collision, then the process defines a child cell located immediately below the intermediate node cell as the target cell (Steps S7 to S8). For the distal end cell, the process effects a transition to a mode in which the occupied cubic region of a cell is recursively oct-divided to determine whether there is a collision within the target cell. If there is a collision, the process confirms the "presence of a collision" and exits the flow, whereas if there is no collision, then the process moves on to Step S5 to continue the flow (Steps S9 to S10).

Figure 4:
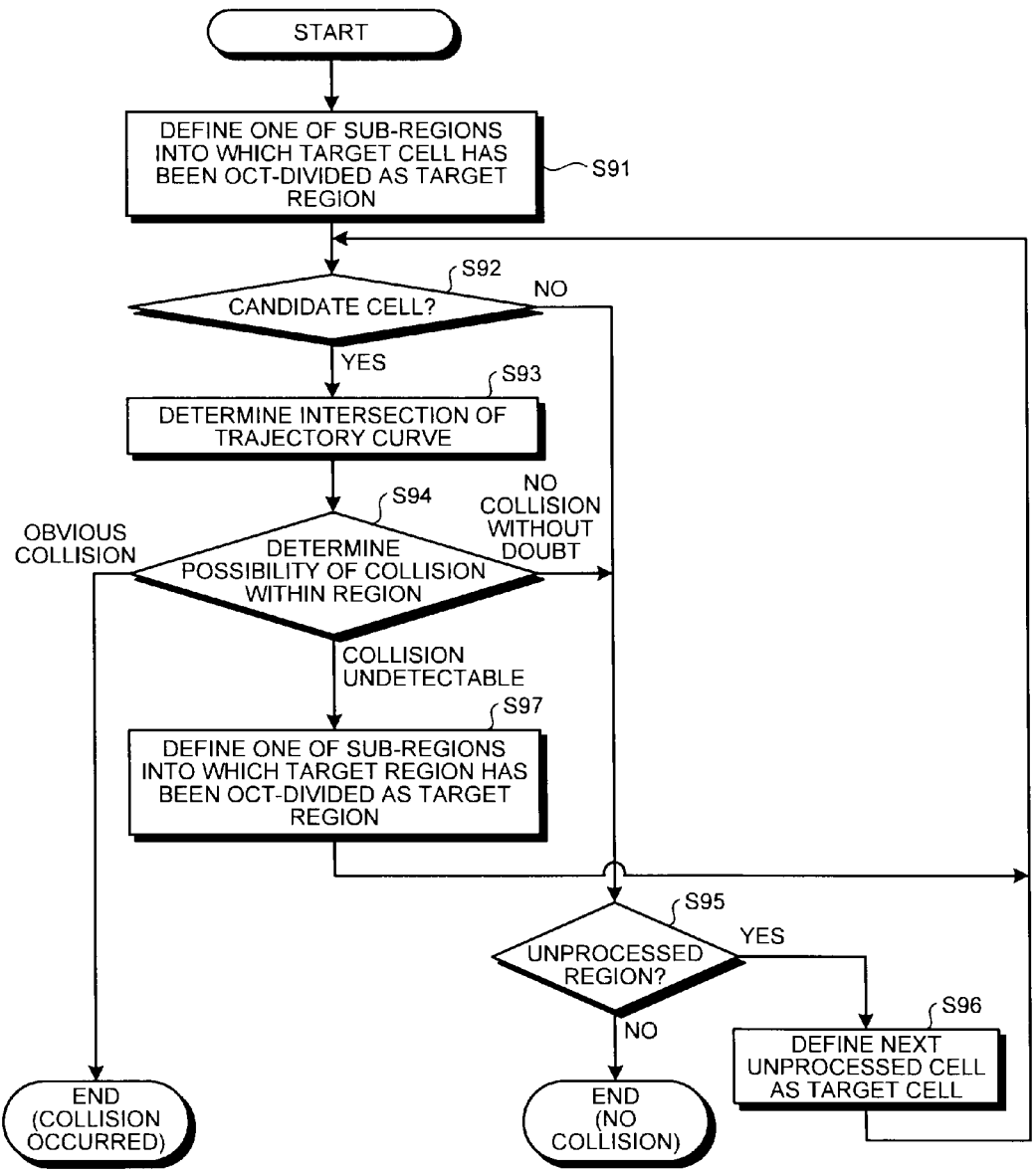
FIG. 4 is a further explanatory flowchart for the collision determination sequence of the present invention.

FIG. 4 is a view showing a process flow for determination of a collision in an octo division mode in which the occupied cubic region of a distal end cell is recursively oct-divided in Step S9 of FIG. 3. In Step S91, the process defines, as a target region (a divided target cell), one of the sub-regions into which the occupied cubic region of a distal end cell has been oct-divided by one stage.

Then, the process determines whether the target region can be a candidate region of which collision with the second object is to be determined (Step S92). This is determined in the same manner as in Step S2 above. If the target region is a candidate region, the process commands the determination test point generation unit 103 to generate determination test points of the target region. The process also commands the spatial curve creation unit 104 to create the trajectory curve of each of the determination test points and the curve intersecting determination unit 105 to determine the presence of an intersection (Step S93).

Subsequently, the process makes a determination based on Conditions 1 and 3 described above (Step S94). When the determination result indicates an obvious collision, then the process confirms the "presence of a collision" and exits the flow of this mode. If no collision occurs without any doubt, then the process defines, as the next target cell, an unprocessed brother region of the target region or otherwise an unprocessed brother region of the immediately upper level region (Steps S95 to S96). If the next target cell is not available, then the process confirms the "absence of a collision" and exits the flow of this mode.

If it cannot be determined whether there is a collision, then the process defines, as the next target region, one of the sub-regions into which the target region has been oct-divided by one stage (Step S97). Note that it is practically more preferable in the aforementioned octo division mode to define such an upper division limit that can stop further dividing operations at a point in time at which the size of the target region is less than the predetermined acceptable margin. Thus, to continue dividing operations beyond the upper limit, the process may preferably exit the flow by confirming the "presence of a collision" for some assurances of safety.

As described above, the present first embodiment eliminates the possibility of a collision being accidentally not detected due to a malfunction found in the time division method and reduces the amount of computation by the determination of a reduced intersection between a curved line and a curved surface. It is thus made possible to determine a collision between objects at high speeds. Furthermore, the shape of one of the objects of which collisions are to be determined is represented by the boundary representation model, thereby allowing for determining a collision with a reduced amount of data.

The series of processing steps by the collision determination device 100 described according to the first embodiment will be performed based on a prepared collision control program. The collision determination program to be executed by the collision determination device according to the first embodiment may be recorded on a computer-readable recording media such as hard discs, flexible discs (FD), CD-ROMs, MOs, and DVDs. Furthermore, the collision determination program may also be provided or distributed via communication networks such as the Internet.

Note that the configuration of each processing unit such as the collision determination control unit 101 is not limited to those of the first embodiment so long as the collision determination program for performing the series of processing steps as mentioned above can determine the possibility of a collision between the first object and the second object. For example, in the first embodiment, the collision determination control unit 101 is configured to serve also as a collision determination unit and a target cell designation unit. However, these functions may be provided separately. Furthermore, the curve intersecting determination unit 105 is configured to serve also as a distance computation unit. However, these functions can be separately provided.

Second Embodiment

The configuration of a second embodiment is illustrated in the same block diagram of FIG. 1 as for the first embodiment. In the second embodiment, the curve intersecting determination unit 105 is configured to determine an intersection between a spatial curve and a constituent surface of the boundary representation model data 107 as well as to calculate the closest distance or the innermost distance. The curve intersecting determination unit 105 is also configured to compute, in the presence of an intersection, the parameter of a curved line at the position of the intersection. This can be obtained by solving the simultaneous equations of a curved line equation for a spatial curve and a curved surface equation for a constituent surface.

Furthermore, when the device confirms the "presence of a collision" in the process flow of the collision determination control unit 101 shown in FIG. 3 and FIG. 4, the device is allowed to continue to make a determination for the next target cell or target region without terminating the present processing. Then, the device determines the value which corresponds to the earliest time of the curved line parameters at the aforementioned intersection position when the parameters are expressed in terms of time. This allows for detecting the time of a collision between the first object and the second object.

INDUSTRIAL APPLICABILITY

As described above, the collision determination device according to the invention is suitable for determining whether or not there is a collision between objects moving within a two-dimensional or three-dimensional space.

REFERENCE SIGNS LIST

100 COLLISION DETERMINATION DEVICE
101 COLLISION DETERMINATION CONTROL UNIT
102 SHAPE DATA STORAGE UNIT
103 DETERMINATION TEST POINT GENERATION UNIT
104 SPATIAL CURVE CREATION UNIT
105 CURVE INTERSECTING DETERMINATION UNIT
106 VOXEL MODEL DATA
107 BOUNDARY REPRESENTATION MODEL DATA
108 RIGID BODY MOVEMENT DATA
201 VOXEL MODEL
202 CELL
203 BOUNDARY REPRESENTATION MODEL
204 OUTER CORNER POINT
205 INNER CORNER POINT
206, 207 ARROW

The invention claimed is:

1. A collision determination device comprising:
a computer comprising a collision determination program executed by the computer to program the collision determination device to function as:
a shape data storage unit that stores both voxel model data representing a shape of a first object by a voxel model and boundary representation model data representing a shape of a second object by a boundary representation model which provides representations with a collection of shaped and oriented boundary elements and an adjacent phase structure between those elements, the voxel model being defined by a coordinate system fixed to the first object, the boundary representation model being defined by a coordinate system fixed to the second object;
a target cell designation unit that designates, among cells constituting the voxel model, a target cell to determine a collision;
a determination test point generation unit that uses at least the voxel model data to generate, as a determination test point that is exclusively used for determining a collision for the target cell, a test point located at a corner of a sub-cubic region obtained by recursively octo-dividing an occupied cubic region of a distal end cell;
a spatial curve creation unit that creates a spatial curve as a trajectory curve of each of the determination test points by applying rigid body movement data representing combined rotational movement as a function of time and translational movement as a function of time, provided to the collision determination device as input to the spatial curve creation unit, indicating a relative rigid body motion of the first object in the voxel model with respect to the second object in the boundary representation model to each of the determination test points;
a curve intersecting determination unit that uses at least the boundary representation model data to determine whether or not each boundary element of the boundary representation model is intersecting the spatial curve;
a distance computation unit that computes a closest distance from the spatial curve to a boundary surface of the boundary representation model, when a determination result provided by the curve intersecting determination unit shows that the spatial curve intersects no boundary element;
and a collision determination unit that determines a possibility of collision between both objects based on both the determination result provided by the curve intersecting determination unit and a computation result provided by the distance computation unit.

2. The collision determination device according to claim 1, wherein, when the determination result provided by the curve intersecting determination unit shows that the spatial curve intersects any boundary element of the boundary representation model; the distance computation unit computes an innermost distance of the spatial curve with respect to the boundary representation model.

3. The collision determination device according to claim 1, wherein, when the spatial curve intersects any boundary element of the boundary representation model; the curve intersecting determination unit computes a parameter of the spatial curve corresponding to a point of intersection.

4. The collision determination device according to claim 1, wherein the voxel model data is represented using an adaptively sampled distance field for representing a shape based on a signed distance from each sample point to the boundary of a shape of the first object, the sample point being on each grid point of a spatial subdivision grids in a tree hierarchy,
the determination test point generation unit generates, as the determination test points, grid points located at corners of the target cell or a grid point located at the center thereof,
the collision determination unit determines whether there is a possibility of collision based on the determination result provided by the curve intersecting determination unit, the computation result provided by the distance computation unit, and distance field values of the determination test points, and
when the possibility of collision regarding the target cell cannot be determined, the target cell designation unit designates a subsidiary cell as a new target cell.

5. The collision determination device according to claim 4, further comprising a collision determination control unit that, when the possibility of collision cannot be determined even for a leaf cell at the bottom of the tree hierarchy as the target cell, oct-subdivides or quad-subdivides the leaf cell depending on the dimension of the voxel model, and that allows the collision determination unit to determine the possibility of collision for the subdivided cells.

6. The collision determination device according to claim 5, wherein
the collision determination control unit repeatedly subdivides the target cell until the collision determination unit can determine the possibility of collision, and stops subdividing the target cell when the target cell being subdivided is less than a predetermined acceptable margin, and
upon stopping of subdividing the target cell, the collision determination unit determines that there is a possibility of collision.

7. The collision determination device according to claim 1, wherein the collision determination unit determines whether there is a possibility of collision between both objects based on both information on each determination test point of the determination test points and a distance reference value derived from information on the target cell or the determination test points, in addition to the determination result provided by the curve intersecting determination unit and the computation result provided by the distance computation unit.

8. A non-transitory computer readable medium containing a computer readable collision determination program for causing a computer reading the program to execute steps including:
designating, among cells constituting a voxel model, a target cell to determine a collision, the voxel model both being defined by a coordinate system fixed to a first object and representing a shape of the first object;
generating, as a determination test point that is exclusively used for determining a collision for the target cell, a test point located at a corner of a sub-cubic region obtained by recursively octo-dividing an occupied cubic region of a distal end cell;
creating a spatial curve as a trajectory curve of each of the determination test points by applying rigid body movement data representing combined rotational movement as a function of time and translational movement as a function of time, provided to the computer reading the computer readable collision determination program as input to the spatial curve creation step, indicating a relative rigid body motion of the first object in the voxel model with respect to a second object in the boundary representation model to each of the determination test points;

determining whether or not each boundary element of a boundary representation model is intersecting the spatial curve, the boundary representation model both being defined by a coordinate system fixed to a second object and representing a shape of the second object;

computing a closest distance from the spatial curve to a boundary surface of the boundary representation model when a determination result provided by the step of determining whether or not each boundary element of the boundary representation model is intersecting the spatial curve shows that the spatial curve intersects no boundary element; and determining a possibility of collision between both objects based on both the determination result provided by the step of determining whether or not each boundary element of the boundary representation model is intersecting the spatial curve and a computation result provided by the step of computing the closest distance.

* * * * *